(12) United States Patent
Schuster et al.

(10) Patent No.: US 8,068,279 B2
(45) Date of Patent: Nov. 29, 2011

(54) OPTICAL SYSTEM OF AN ILLUMINATION DEVICE OF A PROJECTION EXPOSURE APPARATUS

(75) Inventors: Karl-Heinz Schuster, Koenigsbronn (DE); Juergen Hartmaier, Oberkochen (DE); Manfred Maul, Aalen (DE); Dieter Schmerek, Huettlingen (DE); Detlev Mueller, Ellwangen (DE); Otto Hahnemann, Noerdlingen (DE); Frank Marianek, Oberkochen (DE); Gundula Weiss, Aalen (DE); Damian Fiolka, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 892 days.

(21) Appl. No.: 11/685,620

(22) Filed: Mar. 13, 2007

(65) Prior Publication Data

US 2007/0217013 A1 Sep. 20, 2007

Related U.S. Application Data

(60) Provisional application No. 60/782,089, filed on Mar. 14, 2006.

(30) Foreign Application Priority Data

Mar. 14, 2006 (DE) .......................... 10 2006 012 034

(51) Int. Cl.
*G02B 5/30* (2006.01)
(52) U.S. Cl. ..................................... 359/489.15; 359/15
(58) Field of Classification Search .................. None
See application file for complete search history.

(56) References Cited

U.S. PATENT DOCUMENTS

| | | | |
|---|---|---|---|
| 5,610,733 A | 3/1997 | Feldman et al. | |
| 5,850,300 A | 12/1998 | Kathman et al. | |
| 6,856,379 B2 | 2/2005 | Schuster | |
| 2002/0003661 A1 | 1/2002 | Nakai | |
| 2003/0231395 A1 | 12/2003 | Nakai | |
| 2006/0028706 A1 | 2/2006 | Totzeck et al. | |
| 2007/0019179 A1 | 1/2007 | Fiolka et al. | |

FOREIGN PATENT DOCUMENTS

| | | |
|---|---|---|
| DE | 10 2005 039 519 | 2/2007 |
| EP | 1 160 589 | 12/2001 |
| WO | WO 2005/006774 | 1/2005 |
| WO | WO 2005026822 A2 * | 3/2005 |
| WO | WO 2005/121900 | 12/2005 |

OTHER PUBLICATIONS

Merriam-Webster's Collegiate Dictionary, Eleventh Edition, Merriam-Webster Incorporated, 2004, p. 650.*
Office action from the counterpart pending EP Application No. 07 103 867.3, dated Mar. 3, 2008.

* cited by examiner

*Primary Examiner* — Derek S Chapel
(74) *Attorney, Agent, or Firm* — Fish & Richardson P.C.

(57) ABSTRACT

The disclosure relates to an optical system of an illumination device of a microlithographic projection exposure apparatus, including at least one first light-conductance-increasing element having a plurality of diffractively or refractively beam-deflecting structures extending in a common first preferred direction the light-conductance-increasing element having an optically uniaxial crystal material in such a way that the optical crystal axis of the crystal material is substantially parallel or substantially perpendicular to the first preferred direction.

39 Claims, 11 Drawing Sheets

Fig. 8
a)
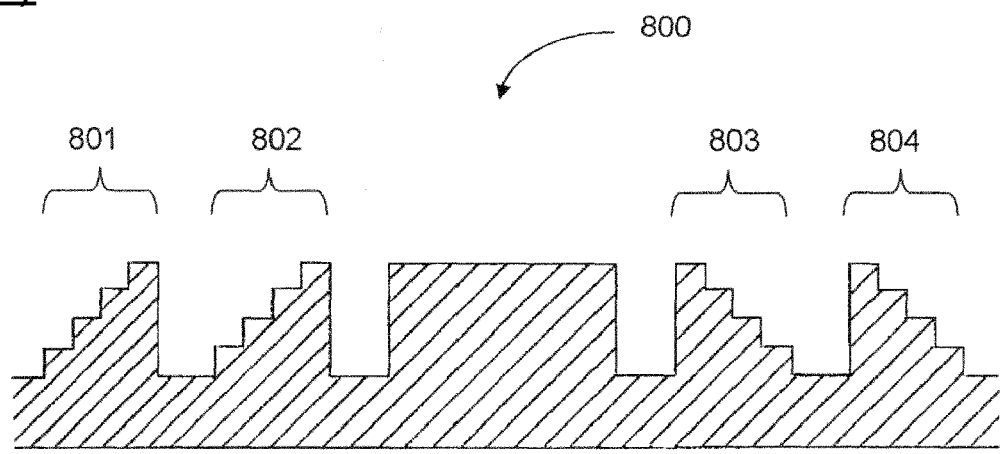
b)
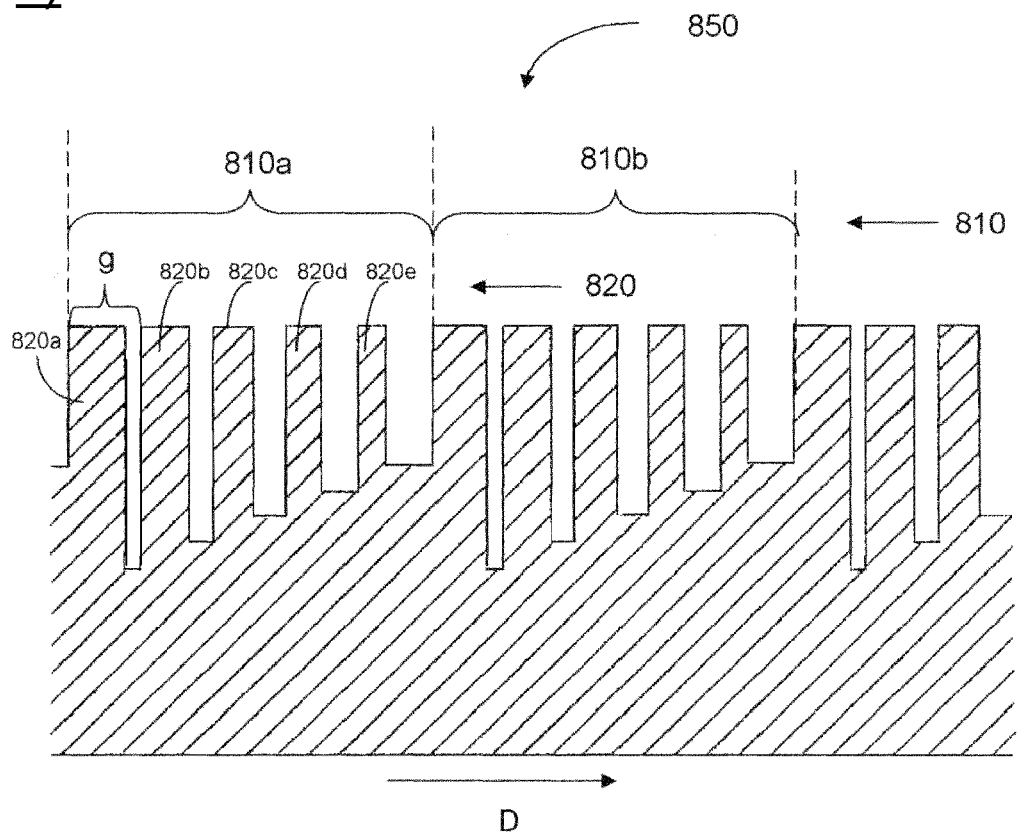

Fig. 8
c)
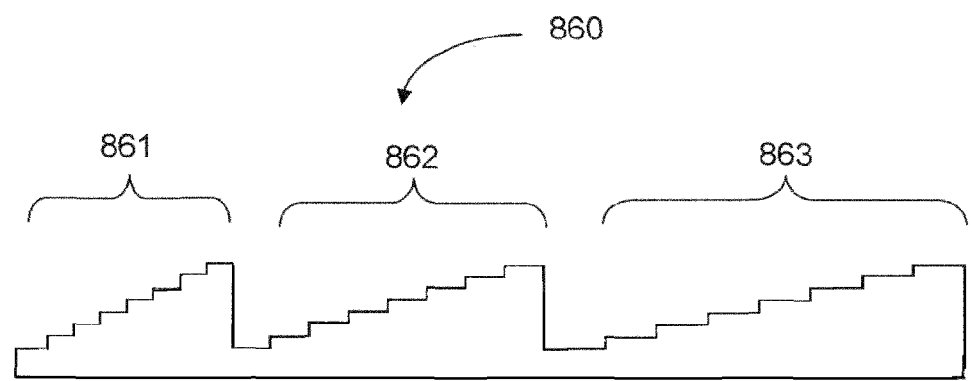
d)
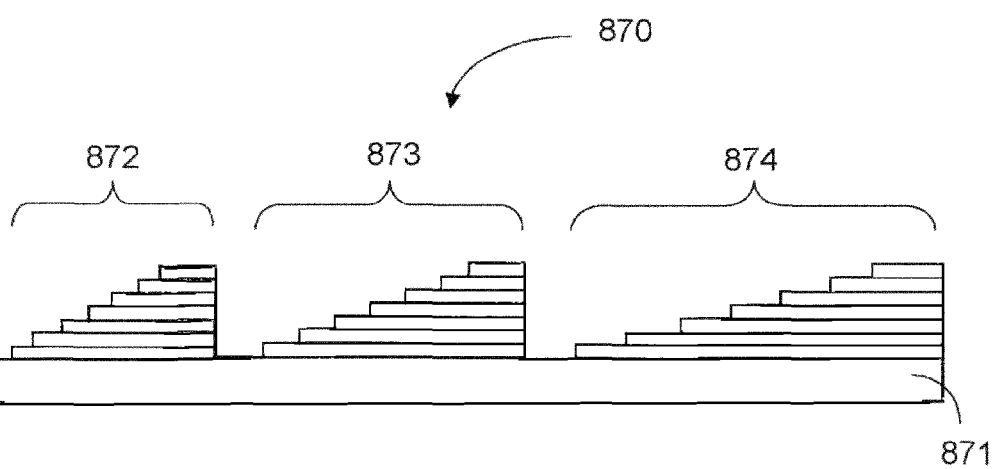
e)
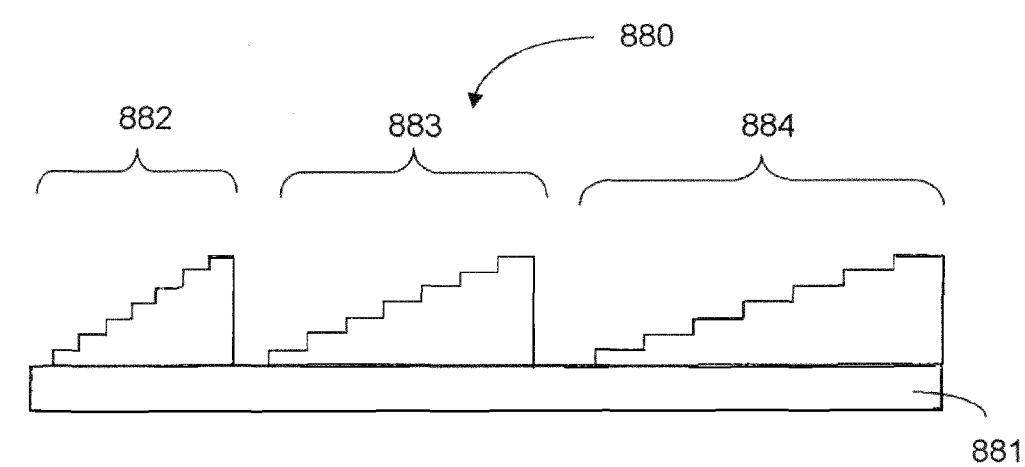

US 8,068,279 B2

OPTICAL SYSTEM OF AN ILLUMINATION DEVICE OF A PROJECTION EXPOSURE APPARATUS

CROSS-REFERENCE TO RELATED APPLICATION

This application claims priority under 35 U.S.C. §119(e)(1) to U.S. Provisional Application No. 60/782,089 filed Mar. 14, 2006 as well as German Patent Application DE 10 2006 012 034.5, filed Mar. 14, 2006. The contents of both of these applications are hereby incorporated by reference.

FIELD OF THE INVENTION

The invention relates to an optical system of an illumination device of a microlithographic projection exposure apparatus, comprising at least one light-conductance-increasing element, in which a generation of light conductance is made possible whilst maintaining the polarization state.

BACKGROUND

In an illumination device of a microlithographic projection exposure apparatus, diffractive optical elements (DOEs) are often used particularly at the entrance in order to produce a desired intensity distribution (e.g. dipole or quadrupole distribution) by means of an angular emission characteristic of the DOE that is defined by the respective diffracting surface structure, e.g. in a pupil plane.

When used in ranges of high energy density of the laser beam, the material of the DOE is subjected to very great loading. With the use of a DOE composed of quartz glass, the short-wave laser light leads to so-called compacting, i.e. local density changes and local anisotropies in the material. A further non-deterministic birefringence distribution is finally established also owing to absorption and the associated heat input and the resultant strains of the material, and destroys the polarization state of the laser light, which can then only be avoided by exchanging the DOE.

A destruction of the polarization state of the laser light can also result when the DOE is formed from isotropic crystal material, owing to crystal structural defects, stress-induced and/or intrinsic birefringence.

SUMMARY

The disclosure provides an optical system of an illumination device of a microlithographic projection exposure apparatus, which enables a generation of light conductance without destroying the polarization state.

An optical system according to the disclosure has at least one first light-conductance-increasing element having a plurality of diffractively or refractively beam-deflecting structures extending in a common first preferred direction, the light-conductance-increasing element having an optically uniaxial crystal material in such a way that the optical crystal axis of the crystal material is substantially parallel or substantially perpendicular to the first preferred direction.

The "light conductance" is also referred to "etendue".

Owing to the use of crystalline material, what is achieved first of all is that (unlike for instance when using quartz glass) no instances of compacting or strains arise on account of the forces acting between the ions situated at predetermined lattice sites, with the result that no compacting-dictated destruction of the polarization state takes place even in the event of high irradiation loadings. Furthermore the use of optically uniaxial crystal material has the consequence that the permanent birefringence tensor provided by such a crystal material is considerably greater (typically by at least a factor of $10^2$ to $10^3$) than the birefringence tensor generated e.g. by crystal structural defects, with the result that the polarization state is practically no longer disturbed by anisotropies such as crystal structural defects, intrinsic or stress-induced birefringence.

In particular, according to the disclosure, the birefringent material is preferably used such that it is irradiated with characteristic states with regard to the polarization, and the deflecting (diffractive or refractive) structures are arranged parallel or perpendicular to the characteristic states. What is thereby achieved is that the induced birefringence effects play no or only a secondary part with regard to polarization.

The formulation "substantially parallel" or "substantially perpendicular" should be understood in the sense of the present application to mean that, according to the disclosure, slight deviations from the exact parallel or perpendicular positioning (e.g. deviations of a few degree, more preferably in the order of 1°) are also still possible and are encompassed by the present application.

Preferably, the beam-deflecting structures are formed on a substrate composed of optically uniaxial crystal material, the optical crystal axis of the crystal material being oriented substantially parallel to the substrate surface.

According to an embodiment, the plurality of beam-deflecting structures of the first light-conductance-increasing element is formed by an arrangement of cylindrical lenses. According to a further embodiment, the plurality of beam-deflecting structures of the first light-conductance-increasing element can be formed by a diffractive optical element (DOE).

In particular, the diffractive optical element (DOE) can be a Computer Generated Hologram (CGH). This Computer Generated Hologram (CGH) can comprise an array of facet areas. Each of the facet areas can comprise a structure which may be calculated by computer in order to achieve the desired beam-deflecting effect, or angular-spread, respectively. The Computer Generated Hologram (CGH) also comprises a substrate being made of a birefringent, optically uniaxial material.

The diffractive optical element (DOE), in particular a Computer Generated Hologram (CGH), may generate a desired two-dimensional intensity distribution (which may in particular have a n-fold symmetry, as given for example in dipole or quadrupole distribution) by way of an angle radiation characteristic defined by the respective beam-deflecting structure. As to the preferred direction of the light-conductance-increasing element chosen according to the present disclosure, this preferred direction can be defined, in the case of a Computer Generated Hologram (CGH), as the direction being oriented from the optical system axis of the illumination device towards an extremum of the two-dimensional intensity distribution. With other words, the preferred direction may also be defined, if applied to a Computer Generated Hologram (CGH), not on the basis of the specific surface structure of the CGH, but on the basis of the beam deflecting effect which is achieved due to this surface structure. Accordingly, the optical crystal axis of the crystal material of the substrate is either substantially parallel or substantially perpendicular to the preferred direction.

According to an embodiment, the array of facet areas can be formed such that the structures of the Computer Generated Hologram (CGH) comprise no discontinuity across a border between adjacent facet areas, as disclosed e.g. in U.S. Pat. No. 5,850,300 and with the advantages described therein. With other words, the structures provided in the individual facet areas of the Computer Generated Hologram (CGH) behave substantially continuous across borders between adjacent facet areas. By avoiding discontinuities (e.g. edges, breaks or the like) between adjacent facet areas, a continuous transition of the phase function can be provided at the borders between the adjacent facet areas, thereby eliminating intensity variations to occur at such borders.

According to a further embodiment, the array of facet areas can be formed such that the structures of the Computer Generated Hologram (CGH) comprise a discontinuity across a border between adjacent facet areas, which may e.g. be useful in providing a greater freedom of design.

According to an embodiment, the array of facet areas is formed such that the structures of the Computer Generated Hologram (CGH) are replicated in no one of the facet areas, which may be useful in order to avoid repeated undesired intensity variations by interaction of structures belonging to different facet areas.

According to a further embodiment, the array of facet areas can be formed such that the structures of the Computer Generated Hologram (CGH) are replicated in at least one facet area of the facet areas.

According to an embodiment, the facet areas have a polygonal shape and are arranged pairwise adjacent to each other. This polygonal shape can particularly be selected from the group consisting of triangle, rectangle, square and hexagon.

According to an embodiment, facet areas being adjacent to each other have different cross-sections, which may be useful in order to avoid repeated undesired intensity variations by interaction of structures belonging to different facet areas.

According to a further embodiment, facet areas being adjacent to each other are alike with regard to their cross-section.

According to an embodiment, the diffractive optical element (DOE) is formed in such a way that the blaze effect is greater for one of two mutually perpendicular polarization states than for the other of the polarization states. According to an embodiment, the two mutually perpendicular polarization states are s-polarization and p-polarization. According to an embodiment, the s-polarized component of light impinging on the diffractive optical element (DOE) is predominantly directed into the ±1st order of diffraction and the p-polarized component of light impinging on the diffractive optical element (DOE) is predominantly directed into the zeroth order of diffraction.

According to an embodiment, the optically uniaxial crystal material is a non-optically-active material.

According to an embodiment, the optically uniaxial crystal material is an optically active material which is present both in a levorotatory and in a dextrorotatory form.

According to an embodiment, the optically uniaxial crystal material has a fluoride compound.

According to an embodiment, the optically uniaxial crystal material has a nitride compound.

According to an embodiment, the optically uniaxial crystal material has an oxide compound.

The optically uniaxial crystal material may be selected, in particular, from the group containing crystalline quartz ($SiO_2$), magnesium fluoride ($MgF_2$), lanthanum fluoride ($LaF_3$) and sapphire ($Al_2O_3$).

In accordance with one preferred embodiment, a second light-conductance-increasing element is disposed downstream of the first light-conductance-increasing element in the light propagation direction, and has a plurality of diffractively or refractively beam-deflecting structures extending in a second preferred direction, the second preferred direction being different from the first preferred direction.

In this case, the second preferred direction is substantially perpendicular to the first preferred direction.

According to an embodiment, the second light-conductance-increasing element is produced from an optically isotropic material at least in the region of the beam-deflecting structures. In particular, the beam-deflecting structures (e.g. cylindrical lenses) may be produced from an optically isotropic material.

The isotropic material may be selected, in particular, from the group containing calcium fluoride ($CaF_2$), strontium fluoride ($SrF_2$), magnesium oxide ($MgO$) and YAG. The isotropic material may furthermore also be an amorphous material, in particular quartz glass.

In accordance with one preferred embodiment, the beam-deflecting structures of the second light-conductance-increasing element are formed on a substrate composed of optically uniaxial crystal material. In this case, the optical crystal axis of the crystal material is preferably oriented substantially parallel to the substrate surface.

Preferably, the optical crystal axis of the crystal material of the second light-conductance-increasing element is substantially parallel or substantially perpendicular to the second preferred direction.

The plurality of beam-deflecting structures of the second light-conductance-increasing element may be formed both by an arrangement of cylindrical lenses and by a diffractive optical element.

According to an embodiment, a first light mixing device is arranged between the first light-conductance-increasing element and the second light-conductance-increasing element.

According to an embodiment, the first light mixing device is an integrator rod.

According to an embodiment, the first light-conductance-increasing element can be arranged at a light entrance surface of the integrator rod.

According to an embodiment, at least one second light mixing device is arranged on that side of the second light-conductance-increasing element which is remote from the first light-conductance-increasing element.

According to an embodiment, the second light mixing device is an integrator rod.

According to an embodiment, the second light mixing device comprises a plurality of integrator rods which are arranged successively in the light propagation direction and between which a light-conductance-increasing element is in each case arranged.

According to an embodiment at least one integrator rod of the first integrator rod, the second integrator rod and the further integrator rods is produced from a birefringent material, in particular quartz ($SiO_2$), magnesium fluoride ($MgF_2$), lanthanum fluoride ($LaF_3$) or sapphire ($Al_2O_3$).

The disclosure also relates to a diffractive optical element comprising at least one first blaze grating and a second blaze grating, the second blaze grating being superimposed on a light exit surface of the first blaze grating and having a substantially ribbed arrangement of substructures which are smaller than an operating wavelength for which the diffractive optical element (DOE) is designed, wherein the diffractive optical element has an optically uniaxial crystal material, the optical crystal axis of the crystal material being substantially parallel or substantially perpendicular to grating structures of the first and/or the second blaze grating.

According to an embodiment the optically uniaxial crystal material has a fluoride compound.

According to an embodiment the optically uniaxial crystal material has a nitride compound.

According to an embodiment the optically uniaxial crystal material has a non-semiconducting oxide compound.

According to an embodiment the optically uniaxial crystal material has a refractive index n of at least 1.6 at an operating wavelength for which the optical system is designed.

The disclosure also relates to a diffractive optical element, a microlithographic projection exposure apparatus, a method for the microlithographic production of microstructured components, and a microstructured component.

Further configurations of the disclosure can be gathered from the description and from the subclaims.

The disclosure is explained in more detail below on the basis of exemplary embodiments illustrated in the accompanying figures.

BRIEF DESCRIPTION OF THE DRAWINGS

In the drawings:

FIG. 8a-e show schematic illustrations for elucidating possible configurations of DOEs used according to the disclosure;

DETAILED DESCRIPTION

Figure 1:
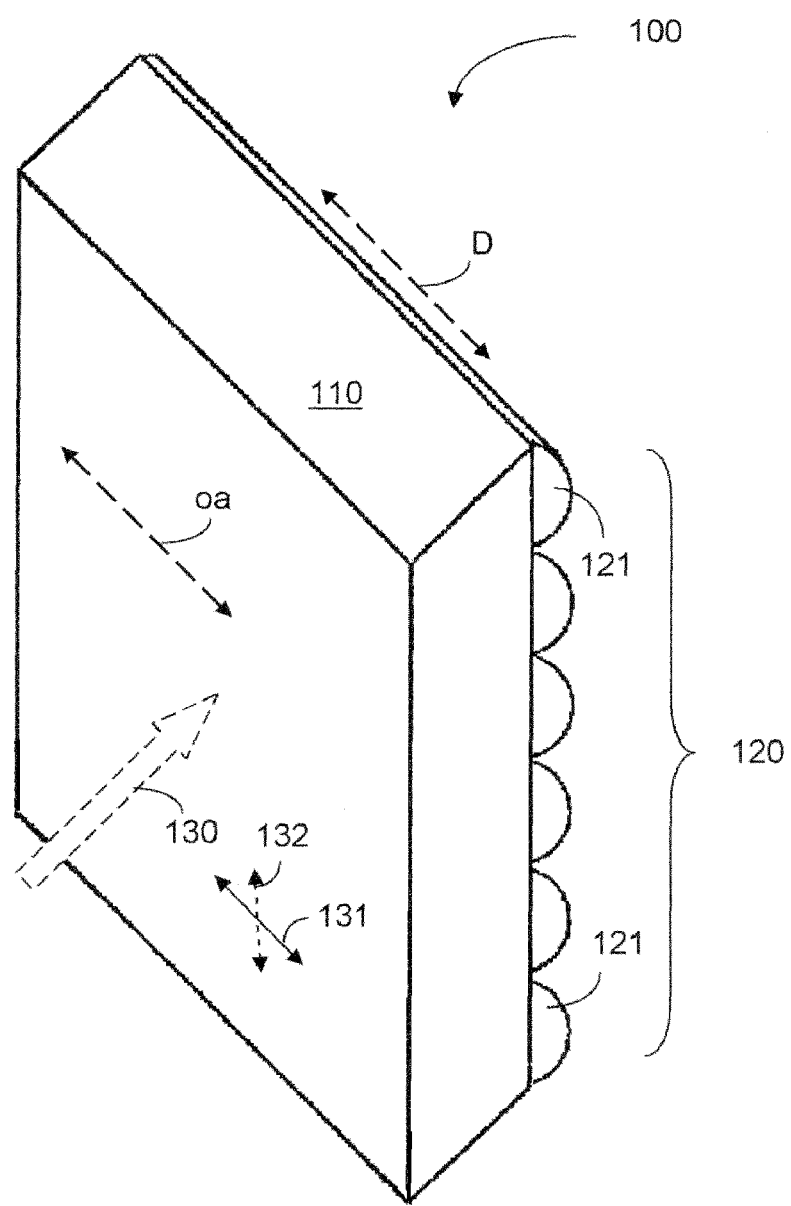
FIG. 1 shows a light-conductance-increasing element in accordance with a first embodiment of the disclosure.

FIG. 1 shows a light-conductance-increasing element 100 in accordance with a first embodiment of the present disclosure.

The element 100 in accordance with FIG. 1 is formed from a carrier plate 110 composed of optically uniaxial, birefringent crystal material, which is magnesium fluoride ($MgF_2$) in accordance with the exemplary embodiment.

Situated on the light exit surface of the carrier plate 110 is a plurality of beam-deflecting structures 120, which, in accordance with the exemplary embodiment, is formed by an arrangement of cylindrical lenses 121, in such a way that the direction (designated by "D" in FIG. 1) of the longitudinal axes of the cylindrical lenses 121 is parallel to one another and also parallel to the optical crystal axis—designated by "oa"—of the optically uniaxial crystal material of the carrier plate 110.

The cylindrical lenses 121 of the element 100 are likewise produced on an optically uniaxial crystal material, namely composed of magnesium fluoride ($MgF_2$) in accordance with the exemplary embodiment. Instead of the $MgF_2$ used, it is also possible to use another suitable optically uniaxial crystal material as material for the carrier plate 110 or the cylindrical lenses 121, for example crystalline quartz ($SiO_2$), lanthanum fluoride ($LaF_3$) and sapphire ($Al_2O_3$). The optical activity must be taken into consideration when using crystalline quartz. If the crystal axis is oriented in the plate or substrate plane and illumination is effected in a collimated manner perpendicular to the plate or substrate plane, there is no effect. In all other cases, the harmful effect can also be prevented by combination of levorotatory and dextrorotatory quartz.

The carrier plate 110 and the cylindrical lenses 121 may comprise the same crystal material or else different crystal materials. Furthermore, the cylindrical lenses 121 may also have a planoconcave form instead of the planoconvex form shown in FIG. 1, and may furthermore also be arranged alternatively at the light entrance surface of the carrier plate 110.

The element 100 in accordance with FIG. 1 serves for use in an optical system, in particular in an illumination device of a microlithographic projection exposure apparatus (not illustrated in FIG. 1), a light propagation direction of the light impinging on the element 100 being indicated on the basis of the arrow 130 in FIG. 1. Furthermore, the arrow 131 is used to designate the preferred direction of polarization of the light, i.e. in the case of linearly polarized light the direction of vibration of the electric field vector E. In the exemplary embodiment, the preferred direction of polarization runs parallel to the optical crystal axis "oa". In accordance with an equally preferred embodiment, as is indicated by the dashed arrow 132, the direction of polarization may also be oriented perpendicular to the optical crystal axis "oa".

Figure 2:
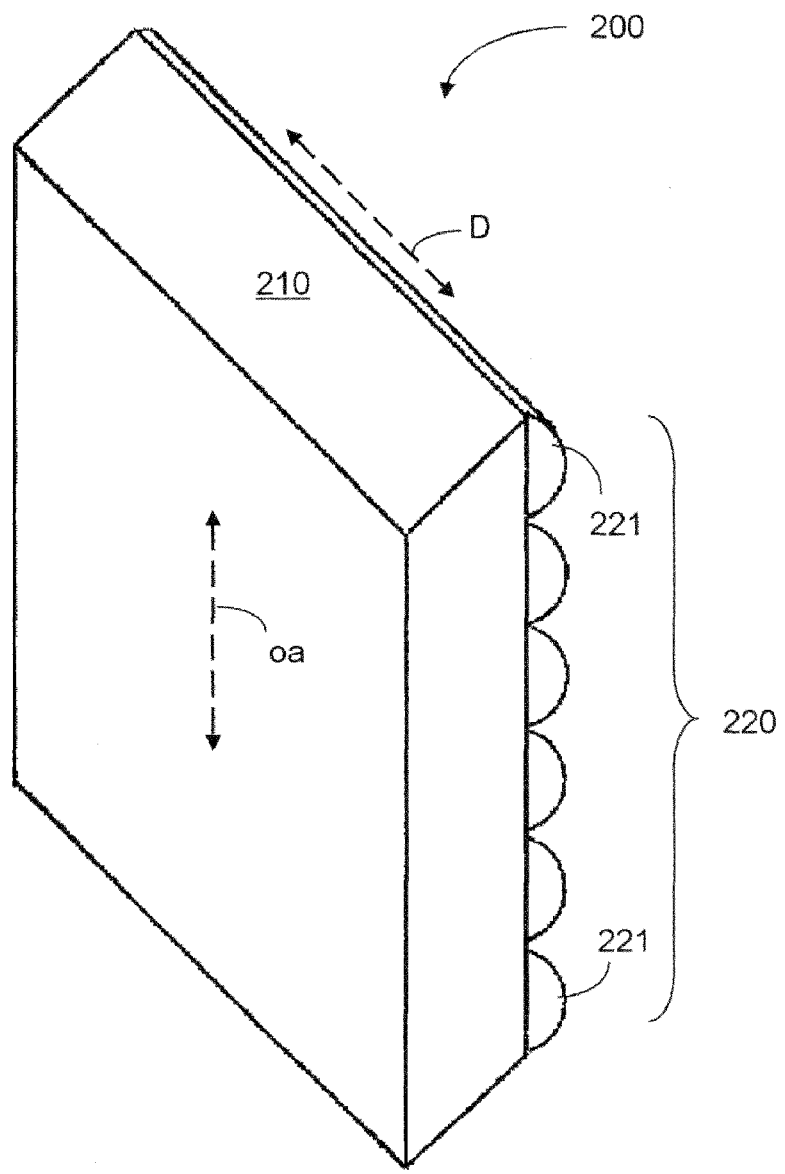
FIG. 2 shows a light-conductance-increasing element in accordance with a further embodiment of the disclosure.

A light-conductance-increasing optical element 200 illustrated in FIG. 2 corresponds to the element 100 illustrated in FIG. 1, corresponding elements having been designed by reference numerals increased by 100. The element 200 differs from the element 100 only by virtue of the fact that the optical crystal axis "oa" of the material of the carrier plate 210 runs perpendicular to the direction—designated by "D"—of the longitudinal axes of the cylindrical lenses 221.

Figure 3:
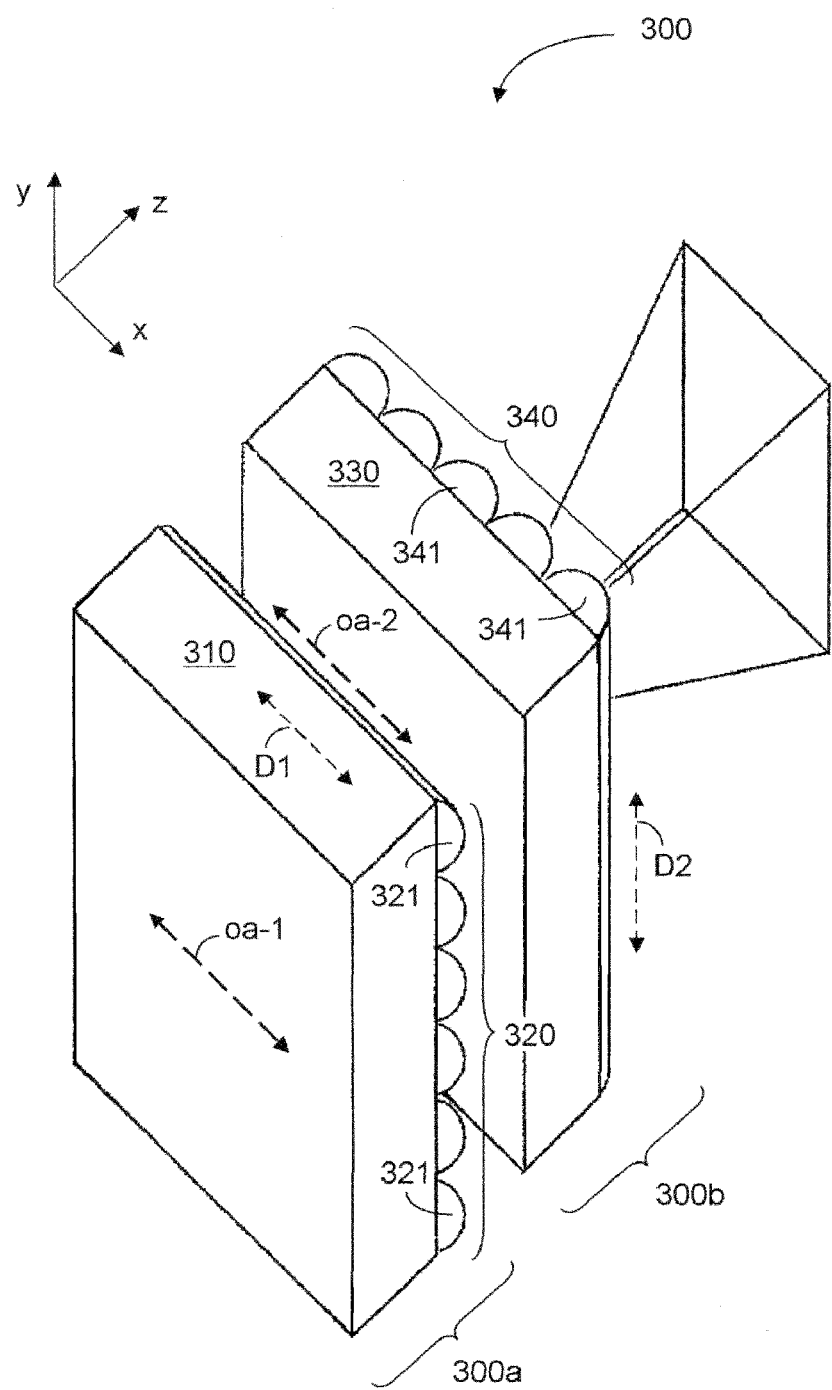
FIG. 3 shows an arrangement according to the disclosure comprising a first and a second light-conductance-increasing element in accordance with one preferred embodiment.

In accordance with FIG. 3, an optical system 300 in accordance with a further preferred embodiment of the disclosure comprises, in addition to a first light-conductance-increasing element 300a (the construction of which in the exemplary embodiment corresponds to that from FIG. 1), a second light-conductance-increasing element 300b. The first element 300a has, at the light exit surface of a carrier plate 310, a plurality of cylindrical lenses 321 whose longitudinal axis (designed by "D1" in FIG. 3), as in FIG. 1, is parallel to the optical crystal axis "oa-1" of the crystal material of the carrier plate 310. Like the first light-conductance-increasing element 300a, the second light-conductance-increasing element 300b comprises a carrier plate 330 composed of optically uniaxial crystalline material (for example $MgF_2$) whose optical crystal axis "oa-2" is parallel to the optical crystal axis "oa-1" of the crystal material of the first carrier plate 310. Situated at the light exit surface of the carrier plate 330 of the second element 300b is an arrangement 340 of cylindrical lenses 341, the orientation (designated by "D2" in FIG. 3) of the longitudinal axes of the cylindrical lenses 341 being perpendicular to the orientation "D1" of the cylindrical lenses 321. Consequently, the optical system 300 comprises, in particular, mutually crossed arrangements 320 and 340 of cylindrical lenses 321 and 341, respectively, by means of which, as likewise indicated in FIG. 3, light conductance is increased in two mutually perpendicular spatial directions (in the x-direction and in the y-direction in accordance with the system of coordinates indicated in the figure).

In contrast to the cylindrical lenses 321 of the arrangement 320, however, the cylindrical lenses 341 of the arrangement 340 do not comprise optically uniaxial crystal material, but rather are composed of optically isotropic material, in particular cubically crystalline material. In accordance with the exemplary embodiment, the optically isotropic material is calcium fluoride ($CaF_2$), but it is also possible to use another material transparent at the operating wavelength, for example strontium fluoride ($SrF_2$), magnesium oxide (MgO) or YAG. Furthermore, in an alternative embodiment, an amorphous material, in particular quartz glass, may also be used as the optically isotropic material.

It goes without saying that the arrangements 320 and 340 of the cylindrical lenses 321 and 341, respectively, may alternatively also be provided at the light entrance surface of the respective carrier plate 310 and 330.

Figure 4:
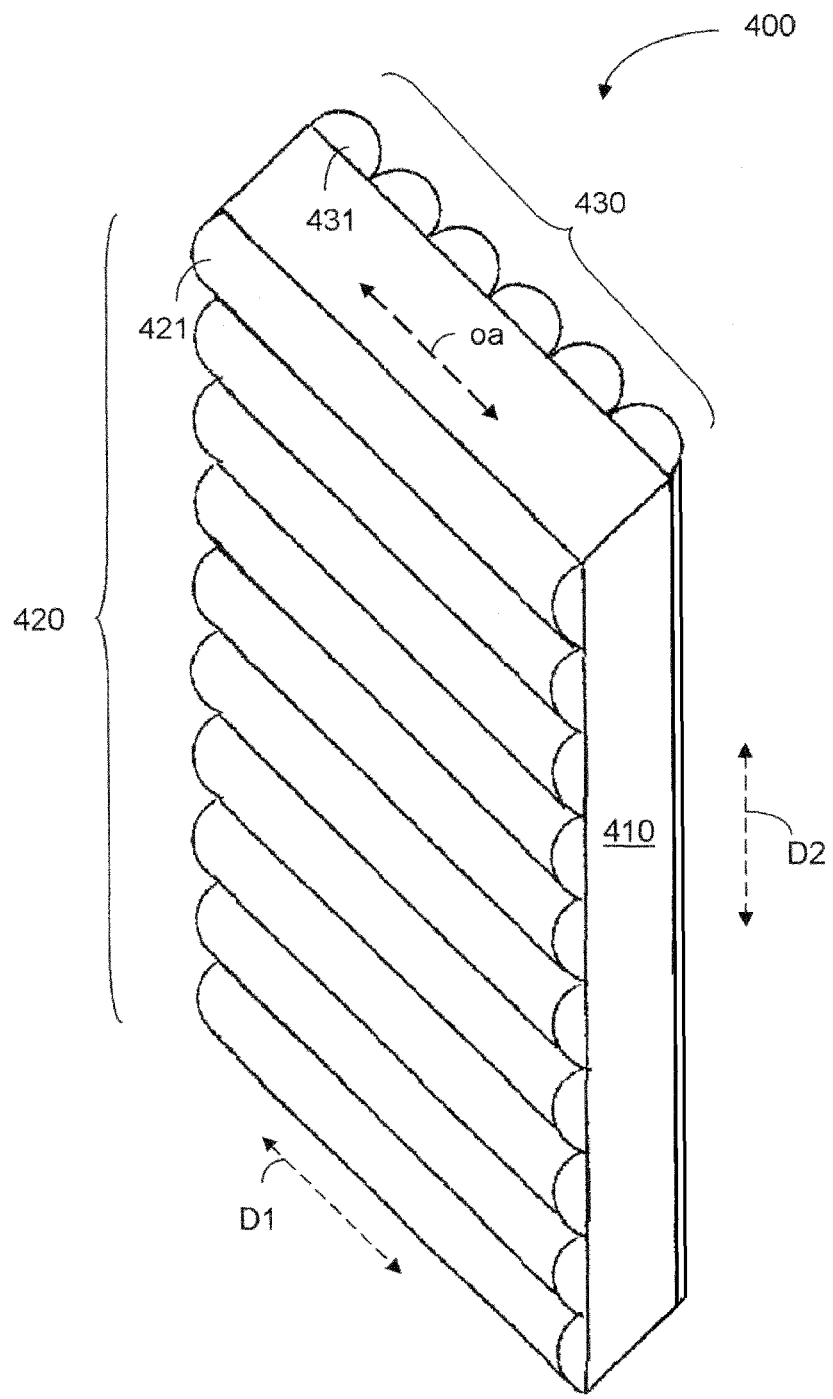
FIG. 4 shows a further embodiment, in which a first and a second light-conductive-increasing element are arranged on a common carrier.

In a further exemplary embodiment illustrated in FIG. 4, crossed cylindrical lens arrangements 420 and 430 having cylindrical lenses 421 and 431, respectively, may also be formed on a common carrier plate 410. The material of the carrier plate 410 is once again an optically uniaxial crystal material (for example $MgF_2$), the optical crystal axis "oa" in the exemplary embodiment being parallel to the orientation "D1" of the longitudinal axes of the cylindrical lenses 421 and perpendicular to the orientation "D2" of the longitudinal axes of the cylindrical lenses 431. Analogously to FIG. 3, the cylindrical lenses 421 of the first arrangement 420 are produced from optically uniaxial crystal material, whereas the cylindrical lenses 431 forming the second arrangement 430 are produced from optically isotropic material.

Figure 5:
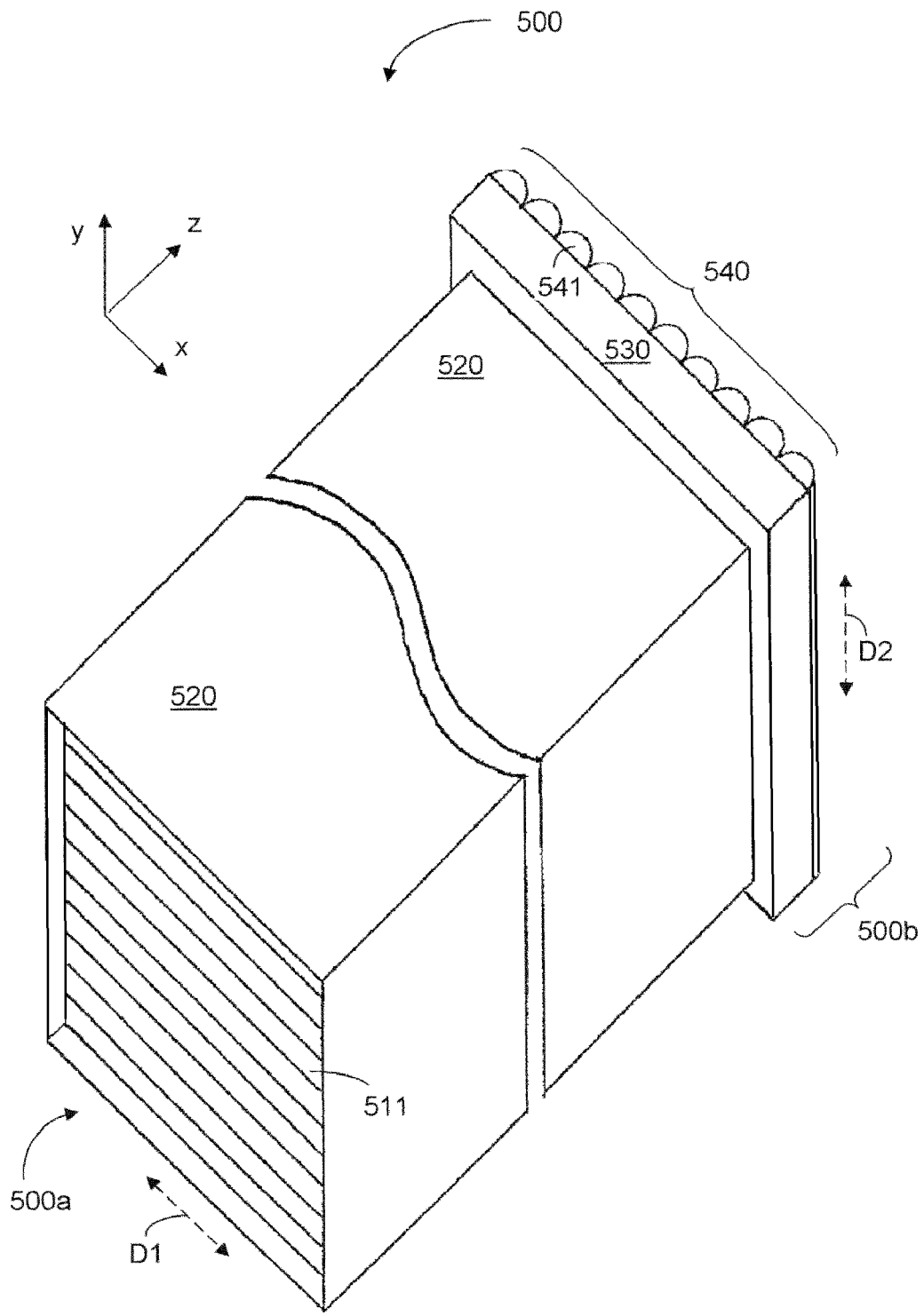
FIG. 5 shows an optical system according to the disclosure with an integrator rod arranged between a first and second light-conductance-increasing element.

In accordance with FIG. 5, in a further embodiment of an optical system 500 according to the disclosure, a first light-conductance-increasing element 500a is arranged at the light entrance surface of an integrator rod 520, and a second light-conductance-increasing element 500b is arranged at the light exit surface of the integrator rod 520. The construction of the first and second light-conductance-increasing elements 500a and 500b, respectively, corresponds to that of the first and second light-conductance-increasing elements 300a and 300b, respectively, from FIG. 3, and so a detailed description is dispensed with here.

The integrator rod 520 is in turn produced from an optically uniaxial crystal material, for example $MgF_2$.

In the arrangement in accordance with FIG. 5, the first light-conductance-increasing element 500a brings about an increase in the light conductance in a first spatial direction, namely in the positive and negative y-direction in accordance with the system of coordinates indicated. By means of the integrator rod 520, light mixing is likewise effected in the y-direction, with the result that only two of the lateral surfaces of the integrator rod 520 (the upper and lower surfaces in FIG. 5) have to be machined in optically plane-parallel fashion. The second light-conductance-increasing element 500b brings about an increase in the light conductance and also intermixing of the light emerging from the integrator rod 520 in a second spatial direction (in the positive and negative x-direction in accordance with FIG. 5) perpendicular to the first spatial direction.

In accordance with further exemplary embodiments (not illustrated), further light-conductance-increasing elements may be disposed downstream of the light-conductance-increasing element 500b shown in FIG. 5, which further light-conductance-increasing elements bring about a further intermixing of the light emerging from the second element 500b.

Figure 6:
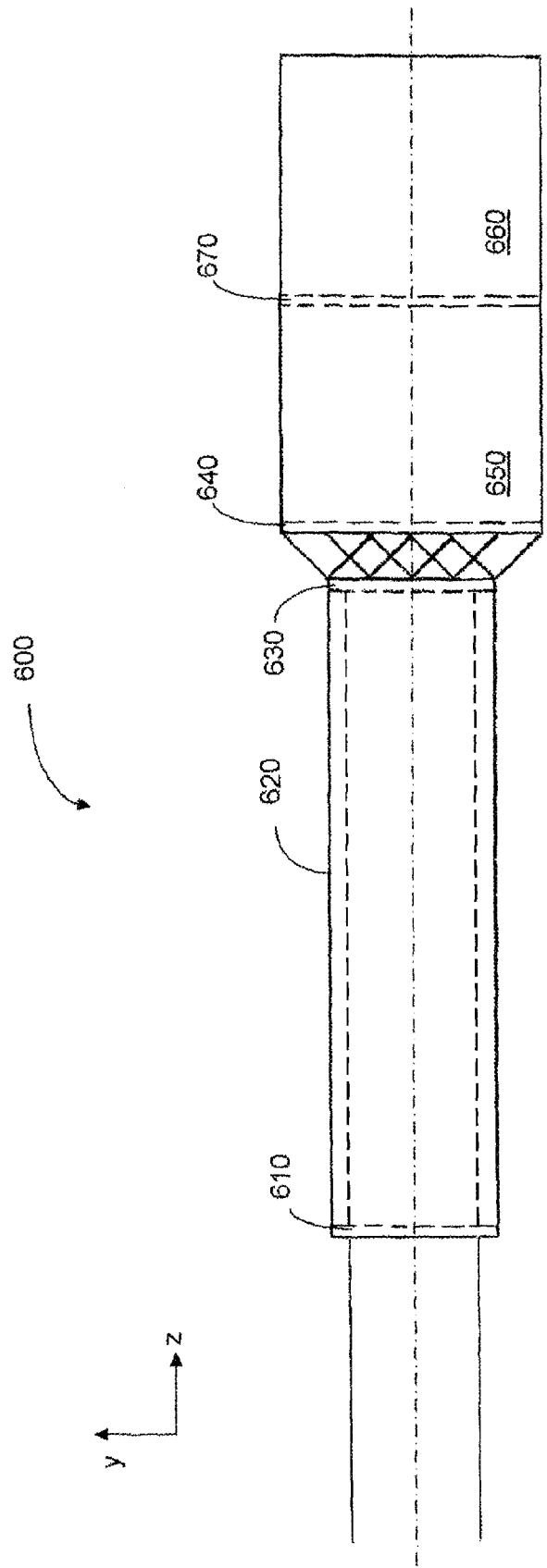
FIG. 6 shows a further embodiment with a plurality of successively arranged light-conductance-increasing elements and integrator rods.

In accordance with FIG. 6, in a further embodiment of an optical system 600 according to the disclosure, a first light-conductance-increasing element 610 is arranged at the light entrance surface of a first integrator rod 620, and a second light-conductance-increasing element 630 is arranged at the light exit surface of the integrator rod 620. The first light-conductance-increasing element 610 results in an expansion perpendicular to the plane of the drawing (in the positive and negative x-direction in accordance with the system of coordinates indicated in the figure), and the second light-conductance-increasing element 630 results in aperture generation in the plane of the drawing (i.e. in the positive and negative y-direction). A third light-conductance-increasing element 640, a second integrator rod 650, a fourth light-conductance-increasing element 670 and a third integrator rod 660 are arranged successively downstream of the second light-conductance-increasing element 630 in the light propagation direction (x-direction). In a generalization of the arrangement of FIG. 6, the light mixing device disposed downstream of the second light-conductance-increasing element 620 comprises a plurality of integrator rods 650, 660 . . . which are arranged successively in the light propagation direction and between which a further light-conductance-increasing element 670, . . . is in each case arranged. In the arrangement of FIG. 6, the integrator rod 620 is once again preferably produced from an optically uniaxial crystal material, e.g. $MgF_2$, the optical crystal axis "oa", analogously to the embodiment of FIG. 5, once again being parallel to the preferred direction of the beam-deflecting structures of the first light-conductance-increasing element 610 and perpendicular to the preferred direction of the beam-deflecting structures of the second light-conductance-increasing element 630 (or visa versa). However, unlike in the embodiments described previously, the light-conductance-increasing element 610, 630, 640 and 670 in accordance with FIG. 6 are formed as diffractive optical elements (DOEs), so that the respective preferred direction of the beam-deflecting structures in each case corresponds to the extending direction of the linear structures present on the DOEs.

In contrast to the integrator rod 620, the integrator rods 650 and 660 are formed from optically isotropic material, $MgAl_2O_4$ in the exemplary embodiment. As an alternative, it is also possible to use another cubically crystalline material or else an amorphous material (e.g. quartz glass) as optically isotropic material.

The optical system 600 shown in FIG. 6 is preferably arranged upstream of the input of a REMA objective present in an illumination device of a microlithographic projection apparatus.

In the embodiments described above, where cylindrical lens arrangements are provided as light-conductance-increasing elements, as an alternative DOEs may also be arranged, and vice versa.

Figure 7:
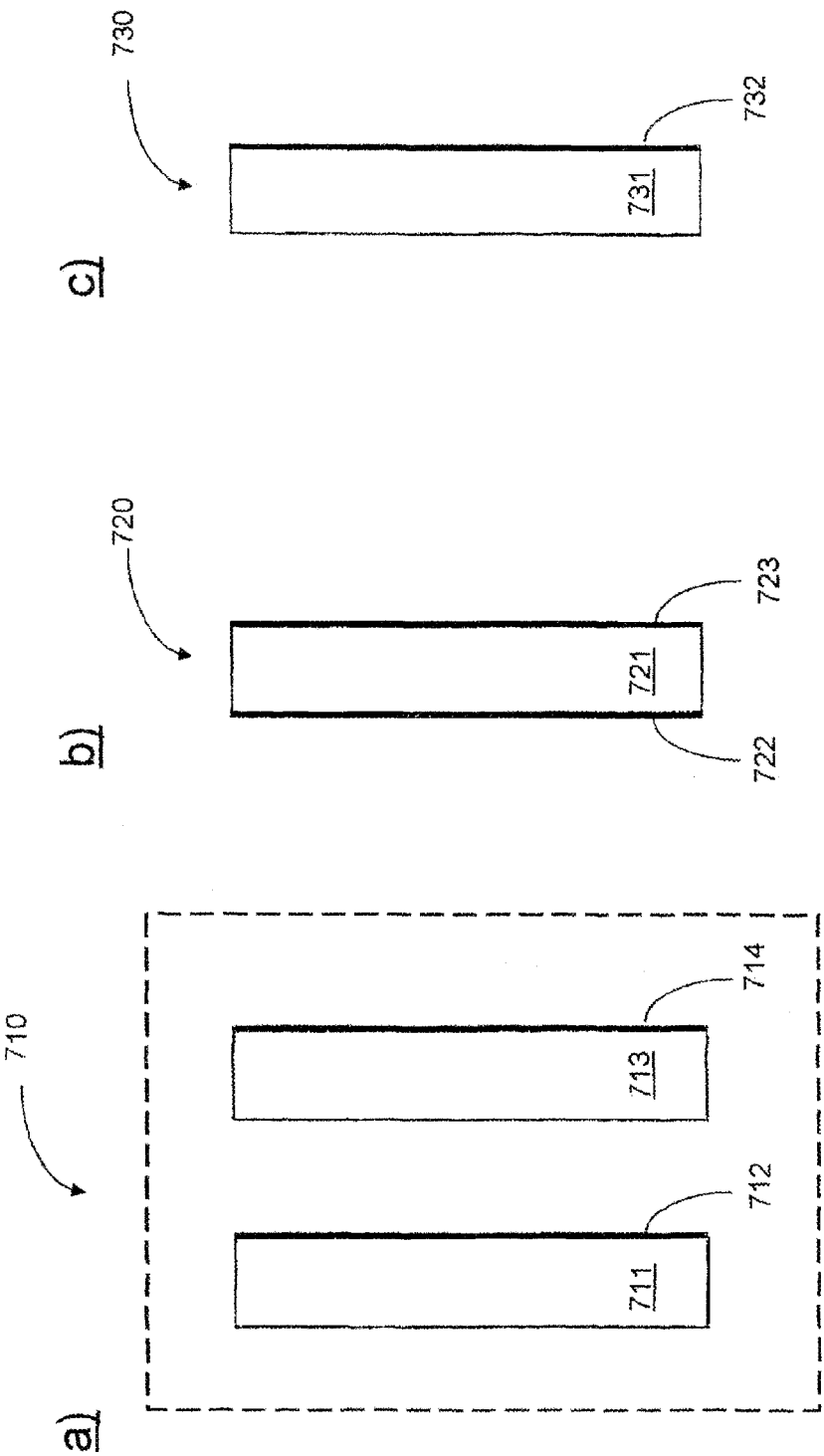
FIG. 7a-c show schematic illustrations for elucidating preferred embodiments of an optical system according to the disclosure with the use of DOEs.

In accordance with FIG. 7a, it is possible, for instance analogously to the exemplary embodiment shown in FIG. 3, to provide a corresponding arrangement 710 comprising a first DOE 712 arranged on a first carrier 711 and a second DOE 714 arranged on a second carrier 713, the second DOE being disposed downstream in the light propagation direction, the DOEs 712 and 714 in each case bringing about light conductance increases in mutually perpendicular spatial directions.

The DOE may be formed in a known manner by the formation of light-opaque structures on a carrier or in the form of light-transmissive structures in specific regions with a varying refractive index and/or varying geometrical thickness.

These structures of a DOE may be performed for example by corresponding material removal in a carrier plate composed of optically uniaxial crystal material. In a further exemplary embodiment, an amorphous layer composed of quartz glass may also be vapor-deposited onto a carrier plate composed of optically uniaxial crystal material, into which layer the patterning is subsequently introduced by etching. The latter embodiment has the advantage that a more uniform formation of the edges present in the structures is possible in the case of patterning of the amorphous layer than in the case of direct patterning of the crystalline carrier plate.

In the arrangement 710 of FIG. 7a, the carrier 711 (and thus, in the case of integral formation with the DOE, also the structures of the DOE 712) is produced from optically uniaxial crystal material, e.g. $MgF_2$. In the case of an integral formation of the second light-conductance-increasing element (by forming the DOE 714 by means of material removal in the carrier 713), the carrier 713 is preferably produced, analogously to the embodiment of FIG. 3, from an optically isotropic material, i.e. either a cubically crystalline material or an amorphous material (e.g. quartz glass). In one preferred embodiment, however the second carrier 713 is produced from optically uniaxial crystal material in the same way as the first carrier, and the DOE 714 is produced by vapor deposition and subsequent etching of an amorphous layer, in particular composed of quartz glass.

It goes without saying that the DOEs 712, 714 may also be arranged on the respective light entrance surface of the carrier 711 and 713.

In accordance with FIG. 7b, it is furthermore possible for DOEs 722 and 723 also to be arranged on a common carrier 721. In this arrangement 720, the carrier 721 is produced from an optically uniaxial crystal material, e.g. $MgF_2$, and the DOE 723 arranged at the light exit surface of the carrier 721 is formed, as described above, by vapor deposition and etching of an amorphous layer composed of e.g. quartz glass. The DOE 722 arranged at the light entrance surface of the carrier 721 may optionally be formed from optically uniaxial crystal material (that is say in particular integrally with the carrier 721 by means of corresponding material removal) or likewise by means of vapor deposition and etching of an amorphous layer composed of e.g. quartz glass.

Furthermore, it is also possible, as indicated in FIG. 7c, to form a more complex DOE structure 732 with deflection in arbitrary spatial directions on a carrier 731 (once again composed of optically uniaxial crystal material), which structure is once again produced by vapor deposition and etching of an amorphous layer composed of e.g. quartz glass.

In further preferred embodiments, the diffractive optical elements (DOEs) used according to the disclosure which have an optically uniaxial crystal material as explained above may also be equipped with a blaze effect in order to direct radiation intensity into a desired order of diffraction, in particular for instance the first order of diffraction, in a targeted manner. For this purpose, in a manner known per se, the respective DOE may be formed with a typically sawtooth or stepped profile with corresponding periodic structures 801, 802, 803, ..., as shown in an exemplary schematic arrangement 800 with reference to FIG. 8a.

In a further preferred embodiment, a DOE according to the disclosure which has an optically uniaxial crystal material as explained above is formed in polarization-selective fashion in such a way that the blaze effect is greater for one of two mutually perpendicular polarization states (in particular s-polarization and p-polarization) than for the other of the polarization states. By way of example, the DOE may be formed in such a way that the s-polarized component of light impinging on the DOE is predominantly directed into the ±1st order of diffraction and the p-polarized component of light impinging on the DOE is predominantly directed into the zeroth order of diffraction.

In accordance with FIG. 8b, a diffractive optical element has a first blaze grating 810 and a second blaze grating 820, the second blaze grating 820 being superimposed on the light exit surface of the first blaze grating 810. In this case, the second blaze grating 820 has an arrangement of substructures 820a-820e, which can be described as comb-shaped or ribbed, the individual substructures 820a-820e (which are only illustrated schematically and are typically present in a significantly greater number) being smaller than the operating wavelength (of $\lambda=193$ nm for example) for which the DOE is designed.

In accordance with the exemplary embodiment of FIG. 8b, in the blaze grating 820 having the sub wavelength structuring of substructures 820a-820e, the filling ratio decreases along the extending direction "D" of the blaze grating 820 from left to right. In this case, the "filling ratio" is to be understood as the ratio of the dimension of the substructures 820a-820e in extending direction "D" relative to the period "g" of the blaze grating 820 having the sub wavelength structuring, with the result that the width of the substructures 820a-820e within each period of the first diffraction grating 810 decreases in the extending direction "D" from left to right in order, given corresponding optimization, to achieve the effect that the s-polarized component of light impinging on the DOE is predominately directed into the first order of diffraction and the p-polarized component of light impinging on the DOE is predominately directed into the zeroth order of diffraction.

The formation of a DOE with a blaze effect in conjunction with a polarization-selective effect with the aim of optimizing the blaze effect only for one of two mutually perpendicular polarization states is not restricted to the arrangement 850 illustrated schematically in FIG. 8b. Thus, the substructures 820a-820e can also be formed uniformly (i.e. with constant width and length) over the period of the second blaze grating 820 in a manner known per se, in order, given corresponding optimization, to obtain a deflection for instance of the s-polarized component into the (±1)st order of diffraction. Furthermore, in a modification of the arrangement shown in FIG. 8b, the substructures 820a-820e may also be formed with constant width and variable length (i.e. variable extent perpendicular to the extending direction "D" of the blaze grating 820), e.g. with a length that decreases within each period of the first diffraction grating 810 in the extending direction "D" from left to right.

The construction of further possible embodiments of DOEs according to the present disclosure is illustrated schematically in FIG. 8c-e.

In accordance with FIG. 8c, by way of example, as illustrated on the basis of a partial region 860 of a DOE, typical DOE structures 861, 862 and 863 are formed by corresponding material removal in a crystalline substrate material composed of e.g. quartz or sapphire ($Al_2O_3$). FIG. 8d shows, on the basis of a partial region 870 of a further DOE, DOE structures 872, 873 and 874 which are applied on a substrate 871 composed of e.g. crystalline quartz or sapphire ($Al_2O_3$) and which comprise a multilayer composed of layers each comprising an oxide or fluoride compound (e.g. $MgF_2$ or $Al_2O_3$). FIG. 8e shows, on the basis of a partial region 880 of a further DOE, integral DOE structures 882, 883 and 884 which are applied on a substrate 881 composed of e.g. crystalline quartz or sapphire ($Al_2O_3$) and which in each case comprise an oxide or fluoride compound, e.g. calcium fluoride ($CaF_2$).

The optical crystal axis of the optically uniaxial crystal material respectively used, in particular in the substrate (that is to say for example the crystalline quartz), is parallel to the substrate surface. Preferably, the optical crystal axis of the optically uniaxial crystal material respectively used in the substrate is, moreover, parallel or perpendicular to the preferred direction of the beam-deflecting structures, and furthermore parallel or perpendicular to the preferred direction of polarization of light impinging on the light-conductance-increasing element. Furthermore, the substrate preferably has a thickness which is an integral multiple of the operating wavelength used (e.g. 193 nm or 157 nm).

Figure 9:
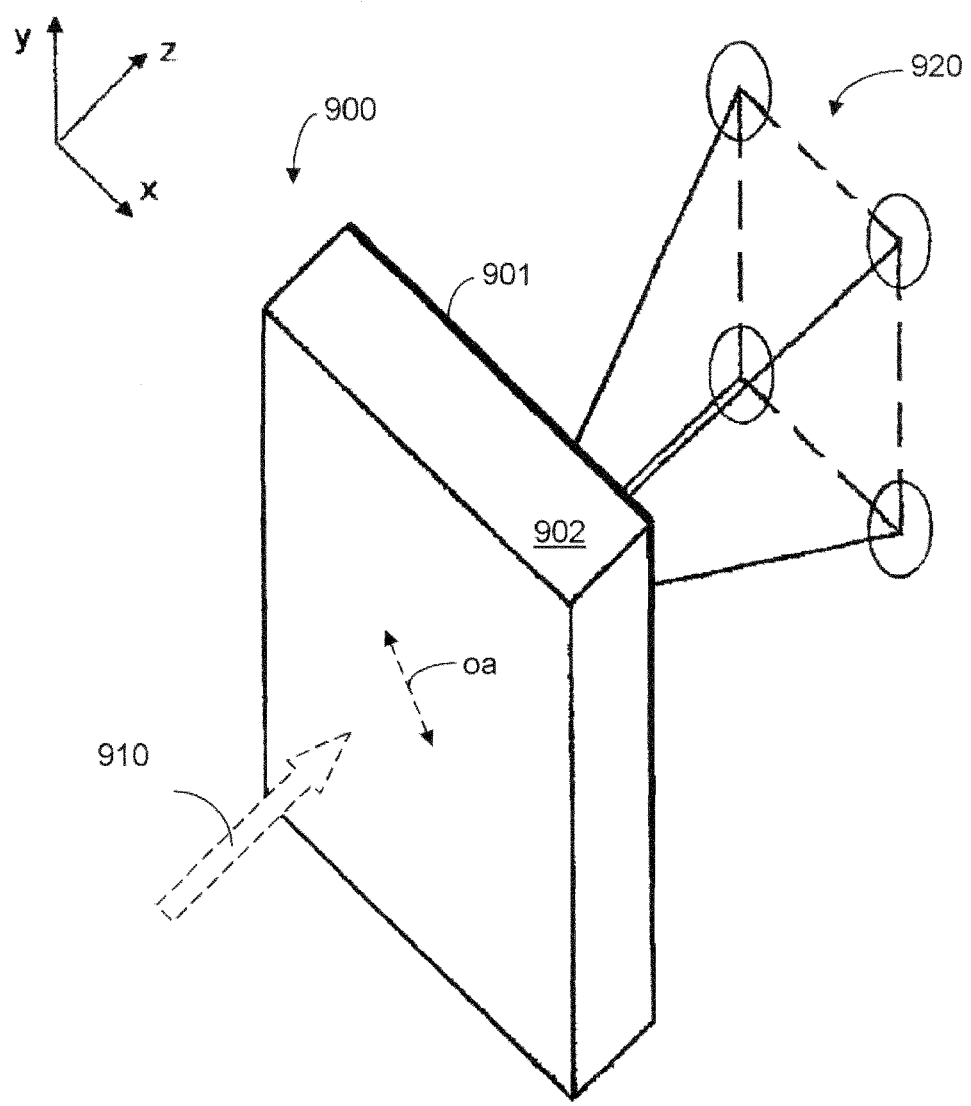
FIG. 9 shows a schematic illustration for elucidating a light-conductance-increasing element according to the disclosure embodied as a CGH.

FIG. 9 shows a schematic illustration for elucidating a light-conductance-increasing element according to the disclosure embodied as a Computer Generated Hologram (CGH) 900. The CGH 900 comprises on its light exit side 901 an array of facet areas (not illustrated), each of which comprising a structure which may be calculated by computer in order to achieve the desired beam-deflecting effect, or angular-spread, respectively.

The CGH 900 generates for incoming light 910 a desired two-dimensional intensity distribution, which is according to FIG. 9 a quadrupole distribution 920, by way of an angle radiation characteristic defined by the respective beam-deflecting structure.

The Computer Generated Hologram (CGH) also comprises a substrate 902 being made of a birefringent, optically uniaxial material e.g. crystalline quartz ($SiO_2$), magnesium fluoride ($MgF_2$), lanthanum fluoride ($LaF_3$) or sapphire ($Al_2O_3$). As to the preferred direction of the light-conductance-increasing element if realized as the CGH 900, the preferred direction can be defined here as the direction being oriented from the optical system axis (which is running in FIG. 9 through the center of CGH 900 and along the z-direction) of the illumination device towards an extremum of the two-dimensional intensity distribution (i.e. in the example of FIG. 9 from the center of the quadrupole distribution 920 to one of the four poles of the quadrupole distribution 920), i.e. along a diagonal line in the square defined by the quadrupole distribution 920. The optical crystal axis of the crystal material of the substrate 902 is either substantially parallel or substantially perpendicular to the preferred direction. A possible orientation of the optical crystal axis oa in the optically uniaxial material of the substrate 902 is illustrated in FIG. 9 by the broken arrow. A further possible direction is perpendicular to the illustrated direction in the x-y-plane.

According to an embodiment, the array of facet areas can be formed such that the structures of the Computer Generated Hologram (CGH) comprise no discontinuity across a border between adjacent facet areas. With other words, the structures provided in the individual facet areas of the Computer Generated Hologram (CGH) behave substantially continuous across borders between adjacent facet areas. By avoiding discontinuities (e.g. edges, breaks or the like) between adjacent facet areas, a continuous transition of the phase function can be provided at the borders between the adjacent facet areas, thereby eliminating intensity variations to occur at such borders. According to a further embodiment, the array of facet areas can be formed such that the structures of the Computer Generated Hologram (CGH) comprise a discontinuity across a border between adjacent facet areas, which may be useful in providing a greater freedom of design.

Furthermore, the array of facet areas can be formed such that the structures of the Computer Generated Hologram (CGH) are replicated in no one of the facet areas, which may be useful in order to avoid repeated undesired intensity variations by interaction of structures belonging to different facet areas. Alternatively, the array of facet areas can be formed such that the structures of the Computer Generated Hologram (CGH) are replicated in at least one facet area of the facet areas.

Figure 10:
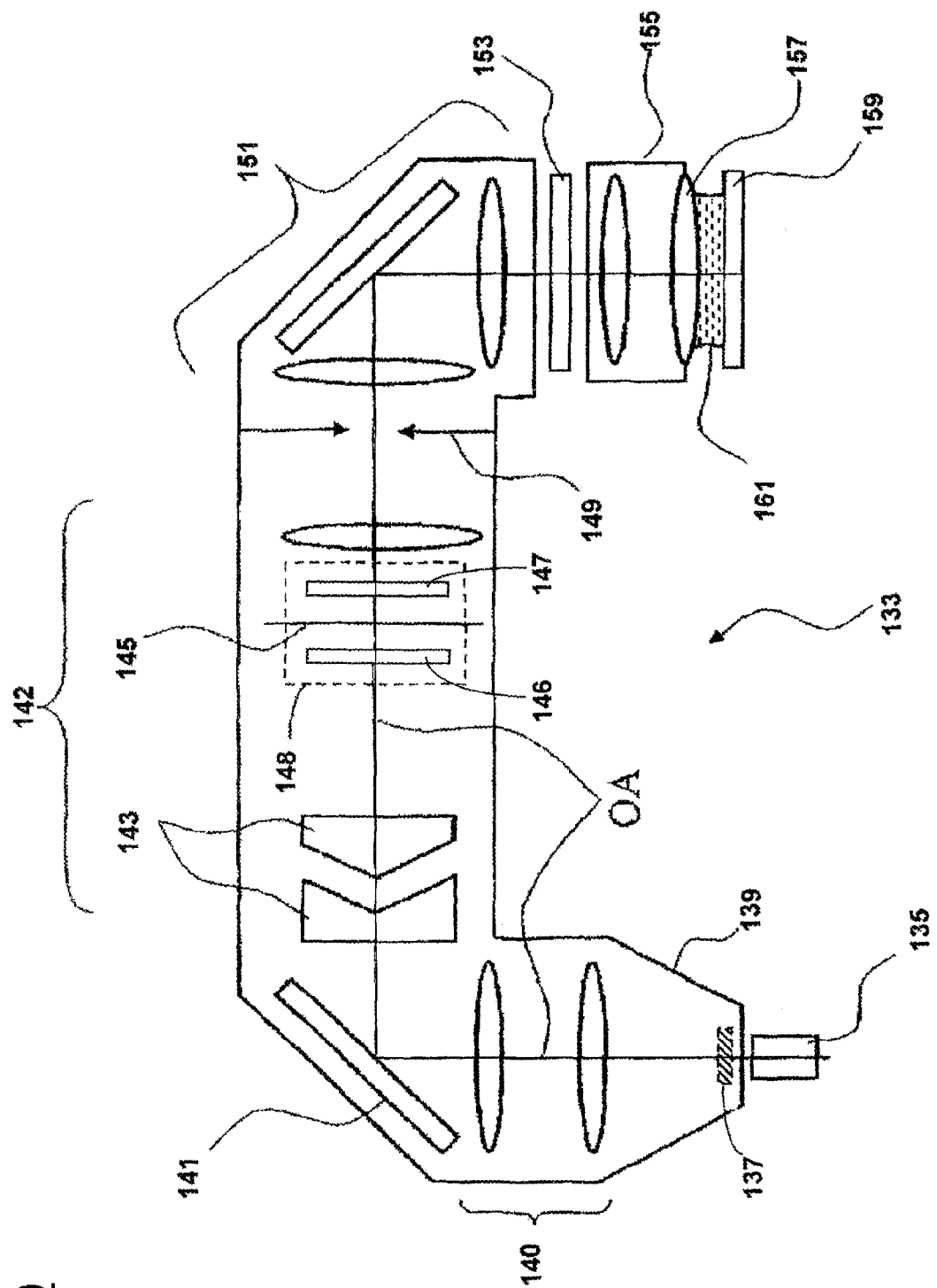
FIG. 10 shows the construction of a microlithography projection exposure apparatus in which an optical system according to the disclosure is used.

FIG. 10 shows, in a schematic illustration, a microlithography projection exposure apparatus 133 comprising a light source unit 135, an illumination device 139, a structure-carrying mask 153, a projection objective 155 and a substrate 159 to be exposed. The light source unit 135 may comprise, as light source, for example an ArF laser for an operating wavelength of 193 nm and also a beam shaping optic that generates a parallel light bundle.

In accordance with the exemplary embodiment, the parallel light bundle firstly impinges on a light-conductance-increasing element 137, which generates a desired intensity distribution, e.g. dipole or quadrupole distribution, by means of the respective diffractively or refractively beam-deflecting structure in a pupil plane 145 and which may be configured as described in the embodiments illustrated above. A zoom objective 140 is situated downstream of the light-conductance-increasing element 137 in the light propagation direction, and generates a parallel light bundle with a variable diameter. The parallel light bundle is directed onto an optical unit 142 by means of a deflection mirror 141, the optical unit having an axicon 143. By means of the zoom objective 140 in conjunction with the upstream light-conductance-increasing element 137 and the axicon 143, different illumination configurations are generated in the pupil plane 145 depending on zoom setting and position of the axicon elements. The optical unit 142 comprises, downstream of the axicon 143, a light mixing system 148 arranged in the region of the pupil plane 145, which light mixing system in this case has, in a manner known per se, an arrangement of micro-optical elements (represented by the elements 146 and 147 in FIG. 10) suitable for obtaining light mixing. The light mixing system 148 may alternatively also be a fly's eye condenser or a rod integrator composed of material transparent to light having the operating wavelength, such as e.g. quartz glass or else crystalline calcium fluoride. The optical unit 142 is followed by a reticle masking system (REMA) 149, which is imaged onto the structure-carrying mask (reticle) 153 by means of a REMA objective 151 and thereby delimits the illuminated region on the reticle 153. The structure carrying mask 153 is imaged onto a light-sensitive substrate 159 by means of a projection objective 155. In the exemplary embodiment illustrated, an immersion liquid 161 having a different refractive index from that of air is situated between a last optical element 157 of the projection objective 155 and the light-sensitive substrate 159.

Even though the disclosure has been described on the basis of specific embodiments, numerous variations and alternative embodiments can be deduced by the person skilled in the art, e.g. by combination and/or exchange of features of individual embodiments. Accordingly, it goes without saying for the person skilled in the art that such variations and alternative embodiments are also encompassed by the present disclosure, and the scope of the disclosure is only restricted within the meaning of the accompanying patent claims and the equivalents thereof.

The invention claimed is:
1. An optical system, comprising:
   at least one first light-conductance-increasing element, comprising:
   a substrate; and
   a plurality of diffractively or refractively beam-deflecting structures extending in a common first preferred direction, wherein:
the plurality of diffractively or refractively beam-deflecting structures are supported by the substrate;
the substrate comprises a first optically uniaxial crystal material having an optical crystal axis that is substantially parallel or substantially perpendicular to the first preferred direction,
the optical system is configured to be used in an illumination device of a microlithographic projection exposure apparatus;
the beam-deflecting structures comprise a second optically uniaxial crystal material; and
during use of the optical system, a polarization state of light that impinges on the at least one first light-conductance-increasing element and a polarization state of light that exits the at least one first light-conductance-increasing element are the same.

2. The optical system according to claim 1, wherein the light-conductance-increasing element is arranged in such a way that the optical crystal axis of the substrate is substantially parallel or substantially perpendicular to a preferred direction of polarization of light impinging on the light-conductance-increasing element.

3. The optical system according to claim 1, wherein an optical crystal axis of the second optically uniaxial crystal material is oriented substantially parallel to a substrate surface.

4. The optical system according to claim 1, wherein the plurality of beam-deflecting structures of the first light-conductance-increasing element comprises an arrangement of cylindrical lenses.

5. The optical system according to claim 1, wherein the plurality of beam-deflecting structures of the first light-conductance-increasing element comprises a diffractive optical element (DOE).

6. The optical system according to claim 5, wherein the diffractive optical element (DOE) is a Computer Generated Hologram (CGH).

7. The optical system according to claim 6, wherein the Computer Generated Hologram (CGH) comprises an array of facet areas.

8. The optical system according to claim 7, wherein the array of facet areas is arranged so that the beam-deflecting structures of the Computer Generated Hologram (CGH) comprise a discontinuity across a border between adjacent facet areas.

9. The optical system according to claim 7, wherein the array of facet areas is arranged so that the beam-deflecting structures of the Computer Generated Hologram (CGH) comprise no discontinuity across a border between adjacent facet areas.

10. The optical system according to claim 7, wherein the array of facet areas is arranged so that the beam-deflecting structures of the Computer Generated Hologram (CGH) are replicated in at least one facet area of the facet areas.

11. The optical system according to claim 7, wherein the array of facet areas is arranged so that the beam-deflecting structures of the Computer Generated Hologram (CGH) are replicated in no one of the facet areas.

12. The optical system according to claim 7, wherein the facet areas have a polygonal shape and are arranged pairwise adjacent to each other.

13. The optical system according to claim 12, wherein the polygonal shape is selected from the group consisting of triangle, rectangle, square and hexagon.

14. The optical system according to claim 7, wherein facet areas being adjacent to each other are alike with regard to their cross-section.

15. The optical system according to claim 7, wherein facet areas being adjacent to each other have different cross-sections.

16. The optical system according to claim 5, wherein the diffractive optical element (DOE) has at least one blaze grating.

17. The optical system according to claim 16, wherein the diffractive optical element (DOE) is arranged so that the blaze effect is greater for one of two mutually perpendicular polarization states than for the other of the polarization states.

18. The optical system according to claim 16, wherein the diffractive optical element (DOE) has a first blaze grating and at least one second blaze grating, grating structures of at least one of the blaze gratings being smaller than an operating wavelength for which the diffractive optical element (DOE) is designed.

19. The optical system according to claim 18, wherein the grating structures of the second blaze grating are supported by the first blaze grating.

20. The optical system according to claim 19, wherein the second blaze grating is superimposed on a light exit surface of the first blaze grating.

21. The optical system according to claim 18, wherein at least one of the blaze gratings has a substantially ribbed structure.

22. The optical system according to claim 18, wherein the first blaze grating has a substantially stepped or a substantially sawtooth-shaped geometry.

23. The optical system according to claim 18, wherein the second blaze grating comprises substructures which are arranged alongside one another along an extending direction and are smaller than an operating wavelength for which the diffractive optical element (DOE) is designed.

24. The optical system according to claim 23, wherein the substructures are supported by the substantially stepped or substantially sawtooth-shaped sections of the first blaze grating.

25. The optical system according to claim 23, wherein the arrangement of the substructures varies in the extending direction.

26. The optical system according to claim 23, wherein the arrangement of the substructures varies perpendicular to the extending direction.

27. The optical system according to claim 23, wherein the filling ratio of the substructures is constant along the extending direction.

28. The optical system according to claim 1, wherein a second light-conductance-increasing element is disposed downstream of the first light-conductance-increasing element in the light propagation direction, and has a plurality of diffractively or refractively beam-deflecting structures extending in a second preferred direction, the second preferred direction being different from the first preferred direction.

29. The optical system according to claim 28, wherein the second preferred direction is substantially perpendicular to the first preferred direction.

30. The optical system according to claim 28, wherein the second light-conductance-increasing element is produced from an optically isotropic material at least in the region of the beam-deflecting structures.

31. The optical system according to claim 28, wherein the beam-deflecting structures of the second light-conductance-increasing element are supported by a substrate composed of optically uniaxial crystal material.

32. The optical system according to claim 28, wherein the optical crystal axis of a crystal material of the second light-conductance-increasing element is substantially parallel or substantially perpendicular to the second preferred direction.

33. The optical system according to claim 28, wherein a first light mixing device is arranged between the first light-conductance-increasing element and the second light-conductance-increasing element.

34. The optical system according to claim 33, wherein at least one second light mixing device is arranged on that side of the second light-conductance-increasing element which is remote from the first light-conductance-increasing element.

35. The optical system according to claim 1, wherein an operating wavelength for which the optical system is designed is less than 250 nm, preferably less than 200 nm, and even more preferably less than 160 nm.

36. The optical system according to claim 1, wherein the substrate has a thickness that is an integral multiple of the operating wavelength used.

37. A device, comprising:
an optical system according to claim 1,
wherein the device is an illumination device configured to be used in a microlithographic projection exposure apparatus.

38. An apparatus, comprising:
an illumination device comprising the optical system according to claim 1,
wherein the apparatus is a microlithographic projection exposure apparatus.

39. A method, comprising:
providing a substrate, to which a layer composed of a light-sensitive material is at least partially applied;
providing a mask having structures to be imaged;
providing a microlithographic projection exposure apparatus;
projecting at least one part of the mask onto a region of the layer with the aid of the projection exposure apparatus,
wherein the microlithographic projection exposure apparatus comprises an illumination system comprising the optical system of claim 1.

* * * * *

UNITED STATES PATENT AND TRADEMARK OFFICE
CERTIFICATE OF CORRECTION

| | | |
|---|---|---|
| PATENT NO. | : 8,068,279 B2 | Page 1 of 1 |
| APPLICATION NO. | : 11/685620 | |
| DATED | : November 29, 2011 | |
| INVENTOR(S) | : Karl-Heinz Schuster et al. | |

It is certified that error appears in the above-identified patent and that said Letters Patent is hereby corrected as shown below:

Column 2, Line 3, delete "$10^2$to" insert --$10^2$ to--.

Signed and Sealed this
Fourteenth Day of February, 2012

David J. Kappos
*Director of the United States Patent and Trademark Office*